United States Patent [19]

Manning

[11] Patent Number: 5,422,499

[45] Date of Patent: Jun. 6, 1995

[54] SIXTEEN MEGABIT STATIC RANDOM ACCESS MEMORY (SRAM) CELL

[75] Inventor: Monte Manning, Kuna, Id.

[73] Assignee: Micron Semiconductor, Inc., Boise, Id.

[21] Appl. No.: 21,274

[22] Filed: Feb. 22, 1993

[51] Int. Cl.6 ............... H01L 29/10; H01L 27/11
[52] U.S. Cl. .................................. 257/67; 257/69; 257/903
[58] Field of Search ............... 257/903, 67, 69, 66, 257/369, 296, 904, 213

[56] References Cited

U.S. PATENT DOCUMENTS

| | | | |
|---|---|---|---|
| 4,905,064 | 2/1990 | Yabu et al. | 257/900 |
| 5,034,797 | 7/1991 | Yamanaka et al. | 257/904 |
| 5,055,904 | 10/1991 | Minami et al. | 257/903 |
| 5,194,749 | 3/1993 | Meguro et al. | 257/903 |
| 5,210,429 | 5/1993 | Adun | 257/903 |

FOREIGN PATENT DOCUMENTS

| | | | |
|---|---|---|---|
| 0465170 | 1/1992 | European Pat. Off. | 257/903 |
| 0279057 | 10/1992 | Japan | 257/903 |

Primary Examiner—Rolf Hille
Assistant Examiner—Alexander Oscar Williams
Attorney, Agent, or Firm—Steven R. Ormiston

[57] ABSTRACT

A new and improved static random access memory (SRAM) cell wherein separate regions of polysilicon are formed over a silicon substrate and are separated by defined openings therein into which oxide filler material is introduced to render the regions of polysilicon and oxide substantially co-planar at their upper surfaces. An access transistor and a thin film load transistor are formed within and adjacent to first and second regions of the polysilicon, respectively, and yet a third, pull down transistor is formed within and adjacent to a third polysilicon region. The thin film transistor includes a thin second layer of polysilicon which is electrically isolated from the second one of the polysilicon regions and is doped to form therein source, drain and channel regions. Advantageously, the thin film transistor is formed on this substantially planar surface, thereby improving process yields and device performance. In a preferred embodiment of the invention, a thick oxide layer is formed and retained over the upper surface of the access transistor, and the thin second layer of polysilicon is extended over this thick oxide layer where it is connectable to a source of supply voltage. In this manner, the thick oxide layer operates to capacitively decouple the access transistor from the supply voltage. Also in a preferred embodiment of the invention, the second layer of polysilicon is extended over the substantially co-planar surfaces described above and into contact with the third polysilicon region to establish an electrical connection between the thin film transistor drain and the pull down transistor gate. Also in a preferred embodiment of the invention, the second polysilicon region includes a buried contact to the silicon substrate which establishes a circuit node for the SRAM cell electrically joining a pull down transistor gate, a pull down transistor drain, and thin film transistor gate, and an access transistor drain.

7 Claims, 5 Drawing Sheets

SIXTEEN MEGABIT STATIC RANDOM ACCESS MEMORY (SRAM) CELL

TECHNICAL FIELD

This invention relates generally to the fabrication of static random access memories (SRAMs) and more particularly to a sixteen (16) megabit SRAM cell having three levels of polycrystalline silicon (polysilicon) interconnect which form a six transistor data storage circuit.

BACKGROUND ART

Various metal-oxide-silicon (MOS) integrated circuit fabrication processes have been developed and used in the production of SRAM memory arrays containing thousands of these six transistor data storage circuits (cells), with each cell including two bulk pull down transistors, two load transistors, and two access transistors. The term "pull down" derives from the fact that the output nodes of these transistors are pulled down to substantially ground potential when the transistors are biased to conduction. Generally speaking, the construction and operation of these bistable transistor circuits are well known to those skilled in the art. The two pull down transistors and the two access transistors are fabricated as MOS devices within the bulk silicon substrate, whereas the two load transistors may be fabricated as thin film transistors (TFTs) and connected between the pull down transistors, respectively, and a source of supply voltage. The source, channel and drain regions of the thin film transistors have been formed in a second level of polysilicon, and the gate electrodes of these thin film transistors are part of a first level of polysilicon which is separated at the TFT channel from the second level of polysilicon by a thin gate oxide layer.

To date, all known sixteen megabit SRAM cells have been fabricated using four or more levels of polysilicon and/or metal interconnect before the formation of the upper bit lines for the cell. In addition, these SRAM cells fabricated by known processes of the prior art have exhibited certain cell stability problems as well as certain yield problems as a result of the particular manner and sequence that the various individual process steps were carried out. For example, the TFT load devices were sometimes formed over stepped, non-planar surfaces. In addition, even slight mask misalignments during IC processing caused electrical shorting between the different levels of polysilicon in the cells. It is the solution to all of the above problems to which the present invention is directed while simultaneously reducing the levels of polysilicon interconnect to a total of three (3) prior to the bit line formation.

SUMMARY OF THE INVENTION

The general purpose and principal object of the present invention is to provide a new and improved SRAM memory cell and related fabrication process which is effective to enhance cell stability and enhance process yields while simultaneously reducing the number of cell polysilicon interconnect levels to three (3). This reduction in the number of cell interconnect levels itself contributes to process yield enhancement as do certain other novel process features described herein.

Another object of this invention is to provide a new and improved SRAM fabrication process of the type described which is compatible with present state of the art MOS planar processing technology used in the fabrication of SRAMs.

Another object of this invention is to provide a new and improved SRAM fabrication process of the type described which serves to enhance device reliability and simultaneously reduce manufacturing cost in this highly competitive SRAM memory device market.

Another object of this invention is to provide a new and improved sixteen (16) megabit SRAM cell of the type described which has a high/performance figure of merit.

To accomplish the above purpose and objects, there has been developed a new and improved sixteen (16) megabit SRAM cell and method of manufacture which includes the steps of forming an access transistor and a pull down transistor in a silicon substrate, and then forming an access transistor word line and a TFT load transistor gate electrode within a first level of polysilicon (poly 1) over the surface of the silicon substrate. Openings in poly 1 between the word line and the TFT load transistor gate and between the TFT gate and the pull down transistor are filled with an oxide which initially extends over the surface of poly 1, but is subsequently planarized at the upper surface of poly 1. Then, a thick oxide region is formed over the word line, and thereafter a second level of polysilicon (poly 2) is formed over this thick oxide region and extended down over the TFT transistor gate where it is there Used to form TFT source, drain and channel regions which define a thin film transistor load for the pull down transistor.

In this manner, the thin film transistor may be formed on a substantially planar surface to enhance process yields and TFT device performance, and the thick oxide region formed over the word line minimizes the capacitive coupling between the word line and poly 2. This latter feature stabilizes a voltage supply which is connected to poly 2 to provide bias voltage and current to all of the above transistors. In a preferred embodiment of the invention, poly 2 is extended into electrical contact with poly 1 where it forms a gate region of the pull down transistor, and the poly 1 gate of the TFT load transistor makes a buried contact with the silicon substrate where it serves as a common circuit node connected to a pull down transistor gate, a pull down transistor drain, a TFT gate, and an access transistor drain.

In a preferred SRAM device embodiment of the invention as broadly claimed herein, the SRAM memory cell includes substantially the integrated circuit structure as formed by the above steps and recited in the broad and well recognized device claim format of the appended device claims.

The above brief summary of the invention, together with its various objects, advantages, and novel features will become more readily apparent from the following description of the accompanying drawing.

DETAILED DESCRIPTION OF THE DRAWINGS

Figure 1:
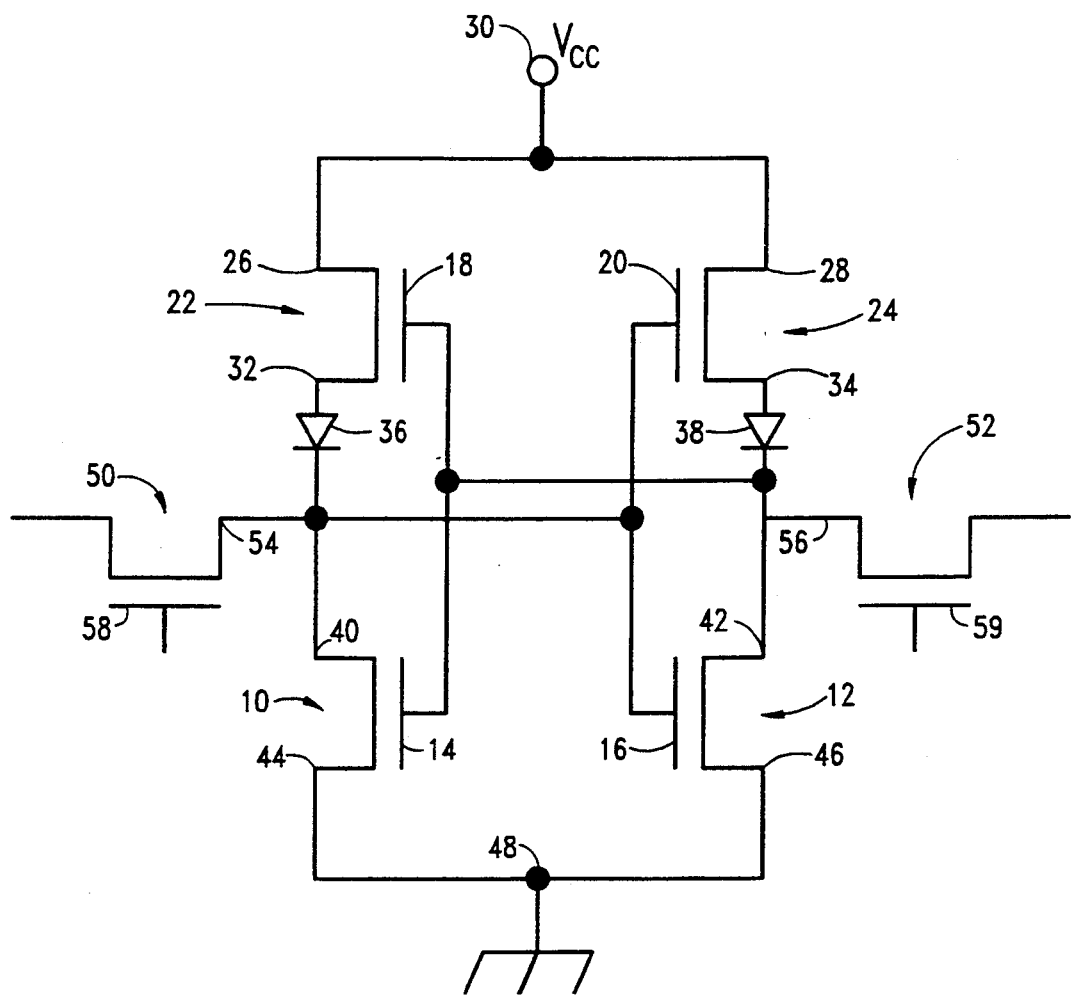
FIG. 1 is a schematic circuit diagram showing a basic six (6) transistor data storage circuit, of which thousands are interconnected in an integrated circuit chip to define the six (6) megabit SRAM cell described herein.

Referring now to FIG. 1, there is shown a basic six (6) transistor stacked CMOS SRAM cell including a pair of N-channel bulk pull down transistors 10 and 12 having their gate electrodes 14 and 16 tied to the gate electrodes 18 and 20 of a pair of TFT load transistors 22 and 24, respectively. The sources 26 and 28 of the TFT load transistors 22 and 24 are connected to the $V_{cc}$ supply voltage at terminal 30, and the drains 32 and 34 of the TFTs 22 and 24 are connected through parasitic diodes 36 and 38 to the drains 40 and 42 of the two pull down transistors 10 and 12. The sources 44 and 46 of the two pull down transistors 10 and 12 are connected to the $V_{ss}$ ground terminal 48.

A pair of N-channel access transistors 50 and 52 are connected as shown with their drains 54 and 56 tied to the drains 40 and 42 of the two N-channel pull down transistors 10 and 12, respectively. The gate electrodes 58 and 59 of the two access transistors 50 and 52 are connected to word lines to be further described relative to the SRAM fabrication process for manufacturing the cell in FIG. 1.

In operation, the pull down transistors 10 and 12 alternately conduct together with their corresponding TFT load devices 22 and 24 when accessed by signals applied via word lines to the gates 58 and 59 of the access transistors 50 and 52 to either read the conductive state of the cell or to change the conductive state of the cell during a write and data storage operation as is well known in the art.

Referring now in sequence to FIGS. 2A through 2I, it should be understood that each of these schematic cross section views represents a number of different individual process steps which have been carried out in order to arrive at the particular device structure shown. These individual process steps will be described in detail in the text below. However, since these individual process steps are well known to those skilled in the art, several of these steps have been combined in the various figures for sake of simplicity and to better point out the novel IC structural features of the SRAM cell as claimed herein.

Figure 2A:
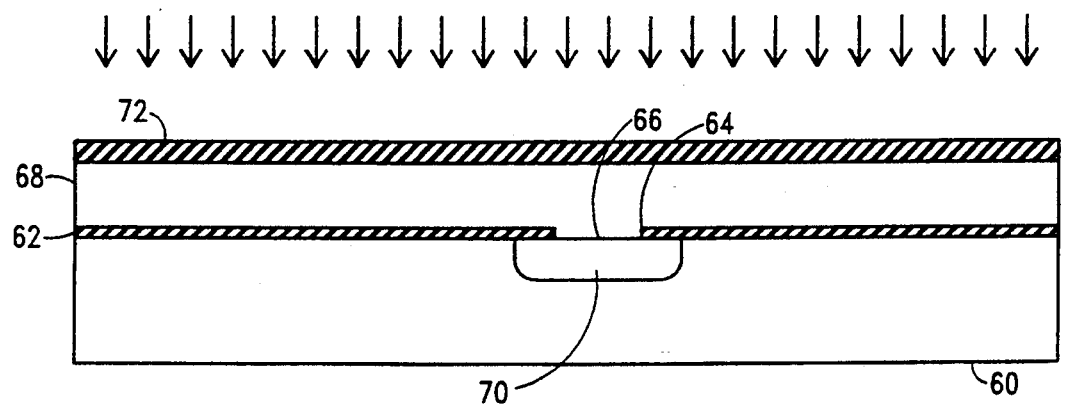
FIGS. 2A through 2I are abbreviated schematic cross section views showing a preferred sequence of process steps which may be carried out in practicing a preferred embodiment of the invention.

Referring now to FIG. 2A, the present process begins with the treatment of a silicon substrate 60 which is part of either a P-well or N-well which has been previously formed and defined in a larger silicon wafer using well known MOS processing techniques. These techniques include, for example, photolithographic masking, etching, and either ion implantation or diffusion in order to form the P-type and N-type adjacent isolation wells in the silicon wafer. These wells are operative, as is well known, to electrically isolate the P-channel and N-channel MOS devices within the silicon wafer. Such a P-well/N-well isolated structure is shown, for example, in U.S. Pat. No. 4,987,089 issued to Ceredig Roberts on Jan. 22, 1991, assigned to the present assignee and incorporated herein by reference.

The silicon substrate 60 is masked with a thin gate oxide layer 62 of $SiO_2$ of about 100 angstroms which is provided with an opening 64 therein and in which a buried contact 66 is formed and is part of a first level 68 of polysilicon (poly 1). N-type impurities such as phosphorus out-diffuse from the polysilicon layer 68 into which they had been previously introduced to thereby form an N-plus interconnect region 70. This interconnect region 70 provides an important interconnect function in the six (6) transistor switching cell shown in FIG. 1 and is described in some detail below. After the polysilicon layer 68 is formed in the geometry shown and to a thickness of about 3000 angstroms, an upper layer 72 of silicon nitride is deposited on the upper surface of the polysilicon layer 68 to a thickness of about 1000 angstroms in order to provide a protective coating for the polysilicon layer 68 when it is exposed to further processing as shown in FIGS. 2B through 2I below. However, the nitride deposition step in forming the $Si_3N_4$ layer 72 as shown in FIG. 2A is optional and may, if desired, be omitted from the process sequence described herein.

Figure 2B:
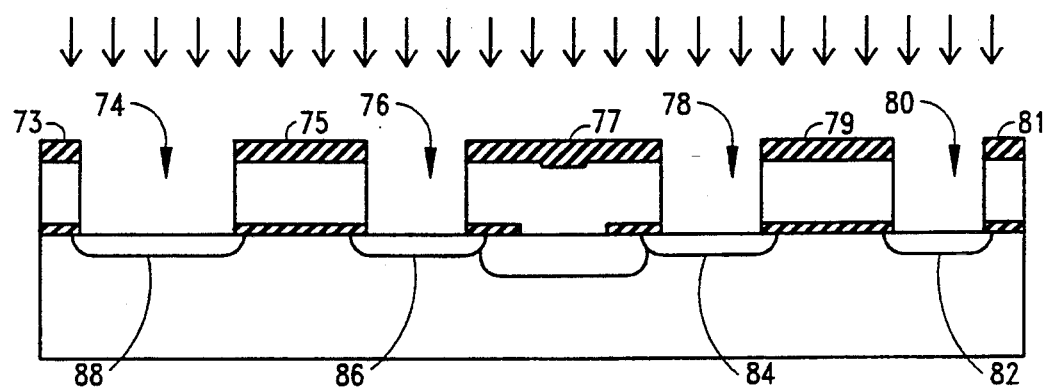

Referring now to FIG. 2B, the structure shown in FIG. 2A is transferred to a conventional photolithographic masking and etching station using, for example, a dry plasma reactive ion etching process wherein a plurality of openings 74, 76, 78, and 80 are formed as shown through both the silicon nitride layer 72 and through the underlying polysilicon layer 68 (poly 1). Then, the etched structure having the openings 74, 76, 78, and 80 therein is transferred to a conventional ion implantation machine wherein an N-type ion specie such as phosphorus ions 82 are implanted through the above openings to form the lightly doped N-type surface regions 82, 84, 86, and 88 as shown. These implanted N-type regions are sometimes referred to in the art as lightly doped drain implants, or LDD implants.

Figure 2C:
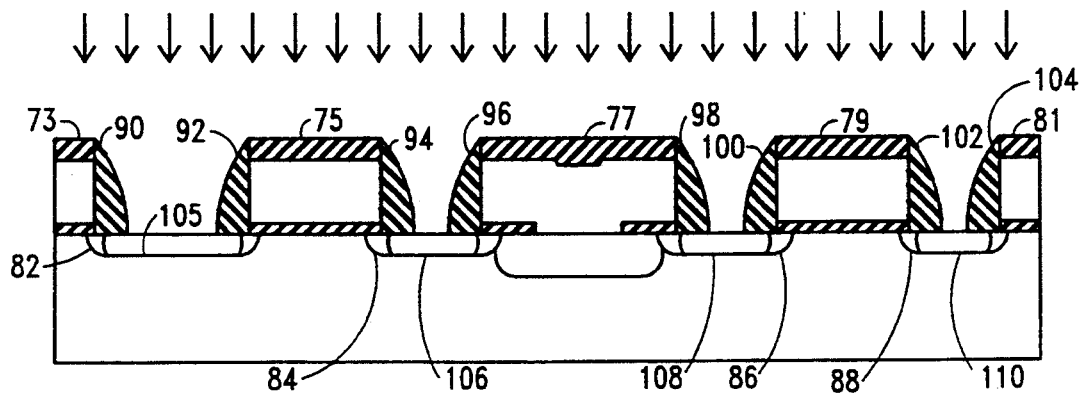

Referring now to FIG. 2C, the structure shown in FIG. 2B is first transferred to an oxide deposition station wherein the contoured spacer oxide regions 90, 92, 94, 96, 98, 100, 102, and 104 are formed as shown at the edges of the remaining sections of poly 1 together with their nitride covering layer, remaining intact as shown and disposed on the surface of the thin gate oxide layer 62. After the formation of these oxide spacer regions 90, 92, 94, 96, 98, 100, 102, and 104, the structure shown in FIG. 2C is again transferred to an ion implantation chamber wherein N-type ion species such as arsenic ions are again implanted into the silicon substrate 60, but at a dosage greater than the dosage used for the LDD implants above, in order to form the N+ contact regions 105, 106, 108, and 110.

Figure 2D:
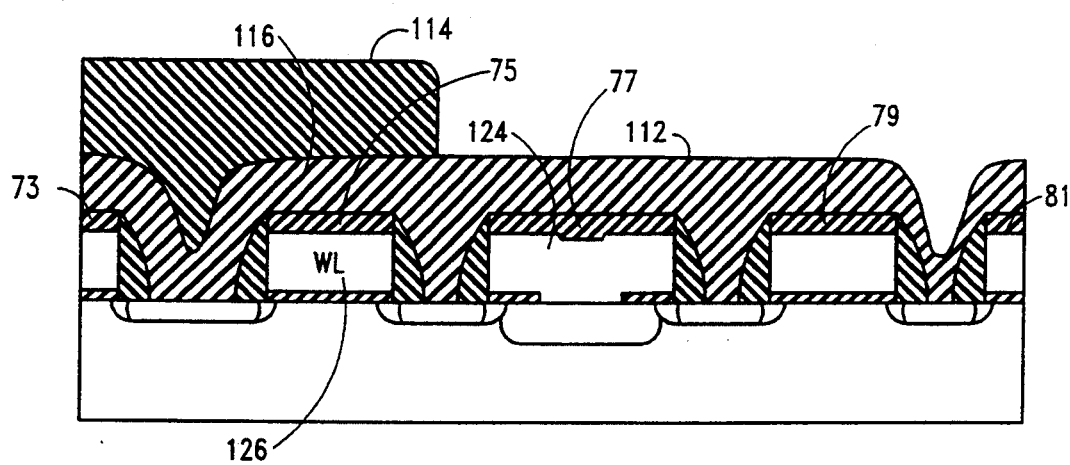

Referring now to FIG. 2D, the structure shown in FIG. 2C is now transferred to a silicon dioxide deposition station wherein a thick surface oxide layer 112 on the order of about 4000 angstroms in thickness is deposited over the entire exposed upper surface of this structure. Then, this structure with the thick oxide layer 112 formed thereon is transferred to a conventional photolithographic masking and etching station wherein a thick photoresist mask 114 is deposited in the geometry shown in order to subsequently protect the underlying oxide region 116 which extends over the word line 126, also designated in the figures as "WL".

Then, the photoresist-masked structure shown in FIG. 2D is transferred to a dry etching station such as a plasma or reactive ion etching process wherein the section of the silicon dioxide layer 112 to the right of the photoresist mask 114 is removed down to the nitride regions 73, 75, 77, and 79 remaining on the top of the first level 68 of polysilicon. Next, the remaining $Si_3N_4$ sections 73, 75, 77, and 79 are removed from the top surface of poly 1 by selective etching, and then the photoresist mask 114 is removed from the section 116 of thick surface oxide to thereby in turn leave the resulting device geometry shown in FIG. 2E.

Figure 2E:
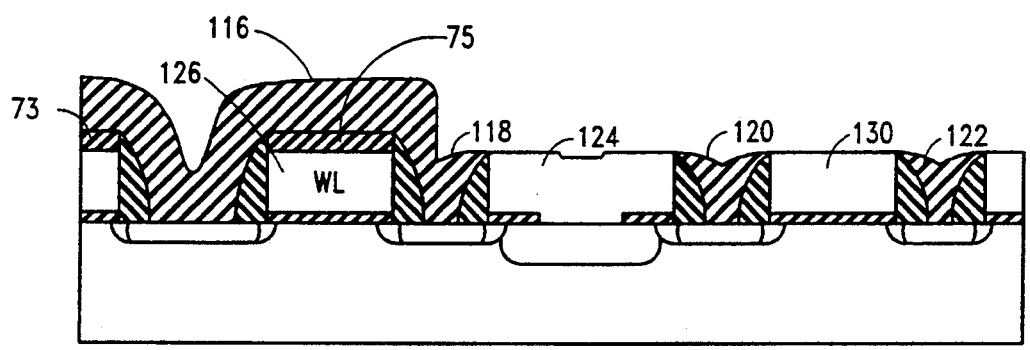

Referring now to FIG. 2E, the above described steps used in forming this device structure are very important for two reasons. First of all, the above thick oxide deposition and etch back steps produce substantially planar surface areas 118 and 120 as a result of the thick oxide remaining between each of the previously defined spacer oxide regions on each side of the poly 1 region 124. This substantially planar oxide geometry which is substantially co-planar with the upper surface of poly 1 is important in providing a substantially planar surface for forming the thin film MOS load transistors which are subsequently formed at the upper surface of the T-shaped buried contact region 124. Secondly, by utilizing the above described photoresist mask 114 to protect the remaining thick oxide layer section 116 disposed on the upper surface of the word line 126, the word line 126 or "WU" is significantly isolated from the thin film transistor voltage supply line in polysilicon level 2 (poly 2) to be subsequently formed on the upper surface of the SiO$_2$ layer 116. Thus, this thick oxide layer 116 minimizes undesirable capacitive coupling between the word line 126 and the V$_{cc}$ voltage supply to be subsequently connected.

Figure 2F:
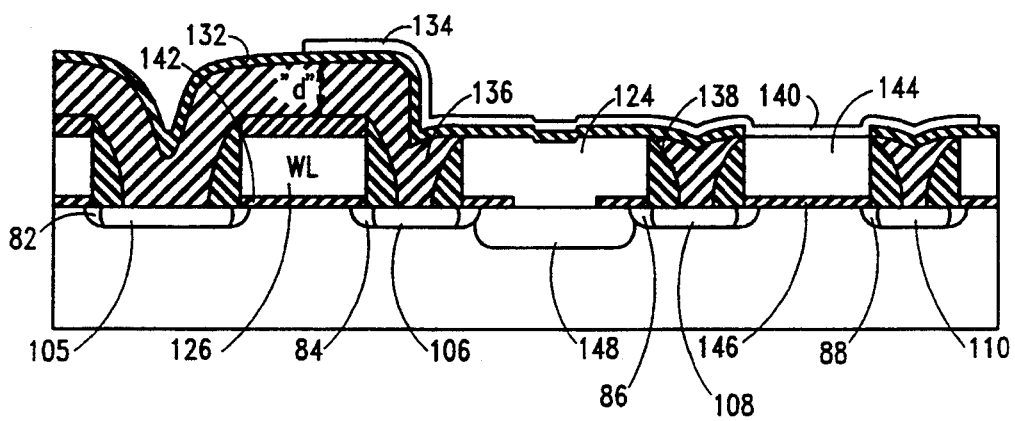

Referring now to FIG. 2F, the structure of FIG. 2E is first transferred to a suitable silicon dioxide deposition station wherein a second, thin gate oxide layer 132 is deposited to a thickness of about 300 angstroms over all of the exposed upper surfaces in FIG. 2E. Thereafter, a second layer of polysilicon (poly 2) 134 is deposited to a thickness of about 400 angstroms in the geometry shown and extends from a V$_{cc}$ contact location on the left hand side of this second level of polysilicon and across the thin oxide layer 132 separating it from the buried contact region 124 in poly 1, and also extending across both oxidized and planarized regions 136 and 138 and then over into rectifying contact at the right hand section 140 of poly 2 where poly 2 region 140 is joined to the section 144 of poly 1. This section 140 of poly 2 forms the gate contact to one of the pull down transistors 10 or 12 shown in the schematic diagram in FIG. 1. This contact 140 to the gate region 144 of a pull down transistor 10 or 12 is also referred to in the art as an "exhumed contact". Because of the P-type doping of poly 2 to form the P-channel TFT on the buried contact 124 and because of the N-type doping of poly 1, a forward biased parasitic diode is formed between the poly 1/poly 2 contact regions 140 and 144.

In accordance with the claim language used herein and viewing the MOS transistor circuit structure from left-to-right in FIG. 2F, the word line (WL) polysilicon level 1 region 126 will be referred to as the access transistor gate electrode; the buried contact region 124 will be referred to herein as the TFT load transistor gate electrode; and the region 144 of polysilicon 1 will be referred to herein as the pull down transistor gate electrode. In relationship to the schematic diagram of FIG. 1, the above gate electrodes 126, 124, and 144 correspond, for example, to the gate electrodes 58, 20, and 14 of the access transistor 50, the TFT load transistor 24 and the pull down transistor 10, respectively. Similarly, the above described IC transistor structure would also correspond to the access transistor 52, the TFT load transistor 22 and the other pull down transistor 12.

Referring again to FIG. 2F, the word line 126 which is separated from the silicon substrate 60 surface by a thin layer or region 62 of gate oxide serves also as the gate electrode for one of the access transistors 50 or 52 in FIG. 1. The drain of the particular access transistor is formed by the N+ region 106 and the surrounding N region 84, whereas the source of the particular access transistor will be formed by the N+ region 104 and the lightly doped surrounding N-type region 82 thus completing the source/drain geometry for the access transistor in a well known manner.

As for the thin film transistor (TFT) loads 22 and 24 shown in FIG. 1, these TFTs are formed by the T-shaped buried contact polysilicon region 124 operating as the TFT gate electrode which is now separated by the thin oxide section 132 which isolates the T-shaped gate electrode 124 from the source S, channel C, and drain D regions of this thin film transistor.

Referring now to the right hand side of FIG. 2F, the pull down transistor 10 or 12 in FIG. 1 is formed by the pull down gate electrode defined by the island 144 of level one polysilicon (poly 1) which makes contact to polysilicon level 2 at the contact region 140, and is further separated from the pull down transistor channel region in the silicon substrate 60 by a thin section 146 of surface oxide 62. The source and drain regions for the pull down transistor are formed by the combination of the heavier doped N+ regions 108 and 110 which are surrounded by the more lightly doped N-type regions 86 and 88 previously identified. Thus, the interconnection 140 in FIG. 2F operates to connect the pull down gate electrode 144 (node 16 in FIG. 1) to the drain region, D, (node 32 in FIG. 1) of the thin film transistor (22 in FIG. 1) formed atop the T-shaped section 124 of polysilicon 1 and from which section 124 the buried contact extends into electrical contact with the N+ region 70 originally formed as described above with reference to FIG. 1. Thus, with reference to the schematic diagram in FIG. 1, the N+ region 70 operates to connect: (1) the gate electrode 20 of one of the TFT load transistors 24 at node 25 in FIG. 1 over to the drain 40 of the other pull down transistor 10; (2) to the drain 54 of the access transistor 50; (3) to the gate electrode 16 of the pull down transistor 12; and (4) the drain 32 of the TFT load transistor 22 via parasitic diode 3.

The word line 126 or WL as shown in FIG. 2F is separated from V$_{cc}$ by an oxide thickness which is sufficiently thick and on the order of about 4000 angstroms in thickness to substantially reduce any capacitive coupling from the word line 126 and into the power supply V$_{cc}$. When the access transistors 50 and 52 are rapidly turned on and off to access the memory cell shown in FIG. 1 by the application of high frequency turn-on pulses to the word line 126, these signals would otherwise be capacitively coupled into V$_{cc}$ and cause the voltage thereon to move about undesirably in the absence of the thick oxide layer 116 above the word line oxide thickness protective nitride coating. Thus, it is this feature and dimension of SiO$_2$ section 116 together with the substantially planarized areas 136 and 138 between openings in poly 1 which result in a significantly improved device performance and process yields. More particularly, this planarized structure including the oxide regions 136 and 138 enable the TFT source, drain and channel regions to be formed on a substantially planar surface rather than over stepped regions as has been the case in some prior TFT configurations and processes for manufacturing these DRAM TFT load transistors.

Figure 2G:
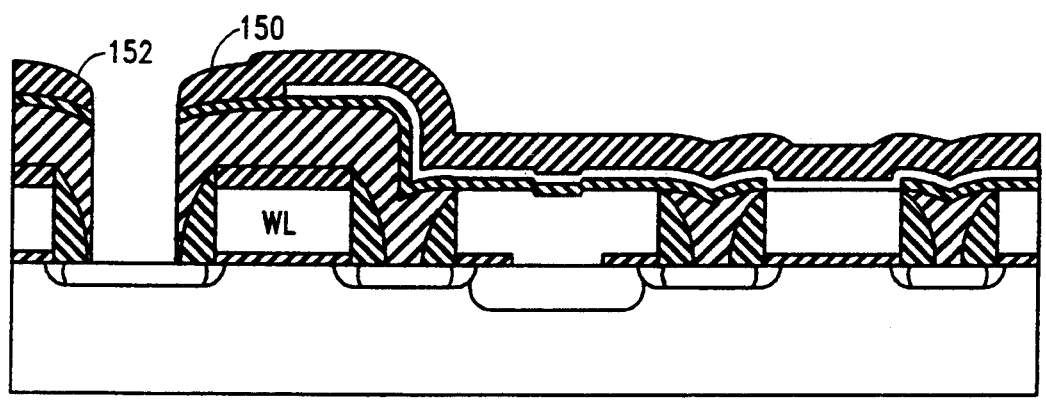

Referring now to FIG. 2G, this structure is formed by first transferring the structure in FIG. 2F above to an oxide deposition station wherein another, thick surface oxide layer 150 is deposited as a protective coating over the $V_{cc}$ polysilicon level 2 at 134 and thereafter transferring the structure to a conventional photolithographic masking and etching station wherein an opening 152 is made in the SiO$_2$ layer 150. This step is done in preparation for the formation of bit line contacts which are subsequently formed in the opening 152 and electrically connected to the N+ drain region 104 of one of the access transistors.

Figure 2H:
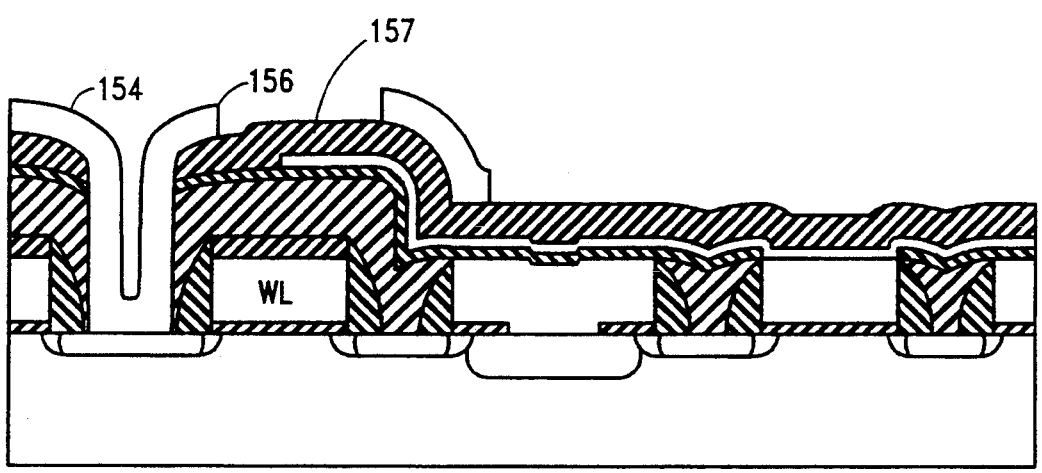
Figure 2I:
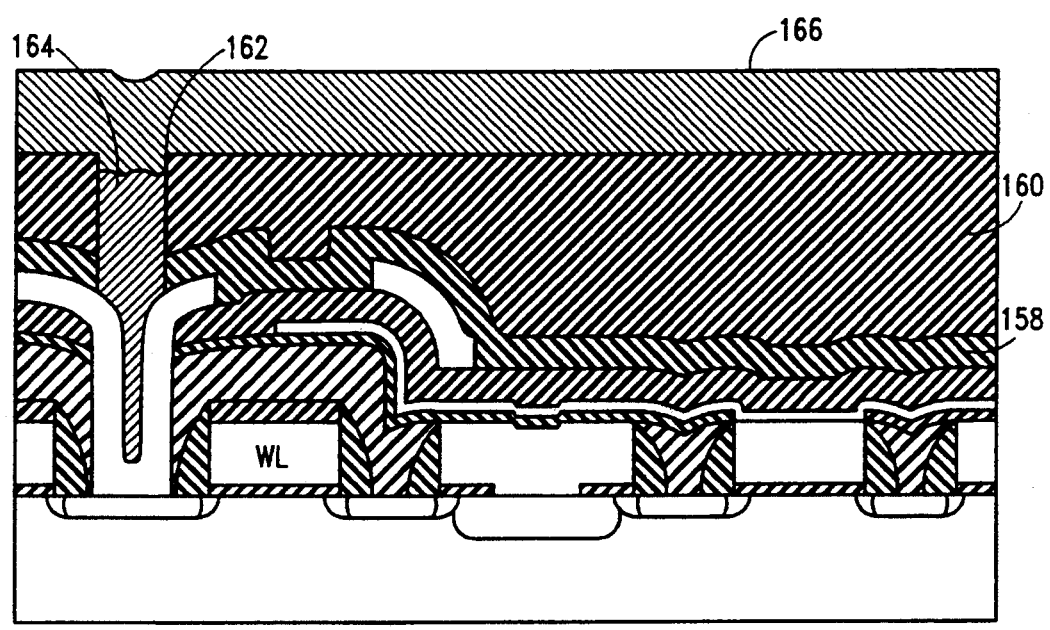

Referring now to FIG. 2H, the structure described in FIG. 2G above is transferred to a polysilicon deposition and masking station wherein yet a third level of polysilicon 154 (poly 3) is deposited and then formed in the geometry shown, including etching an opening 156 in poly 3 to now expose the region 157 of the upper oxide layer 150 immediately above the $V_{cc}$ contact.

Next and finally, the structure shown in FIG. 2H is transferred successively to a number of different wafer processing stations, the first of which operates to deposit another thick surface oxide layer 158 and then deposit a thick upper level of borophosphorous silicate glass (BPSG) 160 completely across the exposed upper surface regions of the integrated circuit structure shown in FIG. 2H. Then, using the conventional photolithographic masking and etching procedures, a large vertical opening 162 is formed through both the BPSG layer 160 and through the underlying SiO$_2$ layer 158 in preparation for the formation of a tungsten, W, post contact 164. This W post connection 164 is an integral part of the bit or digit line of the SRAM and is interconnected to external circuitry by means of an upper metal level 166 which is deposited on the upper surface of the BPSG layer 160.

Since the formation of these tungsten posts 164 and metal layer bit lines 166 interconnecting the access transistor drains to the upper IC metal levels 166 are generally well known in the art and do not, per se, form part of the present invention, many processing details for forming these posts 164 and bit and digit lines 166 have been omitted. However, for a further discussion of the formation and construction of these tungsten posts 164 and their adjoining bit or digit lines 166, reference may be made to co-pending application Ser. No. 07/734,908, now abandoned, of Ruojia Lee and Fernando Gonzalez entitled "Self-Aligned Contact Device and Method for Making High Density Electrical Connections Through Semiconductor Memory Cells" filed Jul. 24, 1991, assigned to the present assignee and incorporated herein by reference.

Various modifications may be made in and to the above described embodiment without departing from the spirit and scope of this invention. These modifications may, for example, involve changes in process mask layouts, changes in materials and doping species and doping parameters and cell circuit connections and the like. Accordingly, these and other process, materials, and device geometry modifications are clearly within the scope of the following appended claims.

I claim:

1. A semiconductor memory cell of the type having transistors fabricated within and adjacent to the surface of a silicon substrate, characterized in that:
  a. a first level of polysilicon formed over the surface of said silicon substrate, said first level of polysilicon comprising first, second and third polysilicon regions separated by openings,
  b. an oxide filler material disposed within said openings so that the surfaces of said oxide filler and the surfaces of said second and third polysilicon regions are substantially co-planar,
  c. a first access transistor formed within and adjacent to said first polysilicon region, said first polysilicon region forming a gate electrode of said first access transistor,
  d. a first thin film load transistor formed within and adjacent to said second polysilicon region, said second polysilicon region forming a gate electrode of said first thin film load transistor,
  e. a second level of polysilicon formed over and electrically isolated from said second polysilicon region and doped to form source, drain and channel regions of said first thin film load transistor, and
  f. a first pull down transistor formed within and adjacent to said third polysilicon region, said third polysilicon region forming a gate electrode of said first pull down transistor.

2. The device defined in claim 1 which further includes a thick oxide layer disposed on top of said first access transistor, and said second level of polysilicon being extended from said source, drain and channel regions of said first thin film load transistor over said thick oxide region where it is substantially capacitively decoupled from said first access transistor.

3. The device defined in claim 1 wherein said second level of polysilicon is extended over and into electrical contact with said third polysilicon region to establish electrical contact between said first thin film load transistor drain region and said first pull down transistor gate electrode.

4. The device defined in claim 3 wherein a contact is formed between said second polysilicon region and said silicon substrate to thereby establish a common circuit node which connects (1) said gate electrode of said first thin film load transistor, (2) a drain of said first pull down transistor, (3) a drain of said first access transistor, (4) a gate electrode of a second pull down transistor and (5) a drain of a second thin film load transistor.

5. A semiconductor memory cell of the type having transistors fabricated within and adjacent the surface of a silicon substrate, characterized in that:
  a. a first level of polysilicon formed over the surface of said silicon substrate, said first level of polysilicon comprising first, second and third polysilicon regions separated by openings,
  b. an oxide filler material disposed within said openings so that the surfaces of said oxide filler and the surfaces of said second and third polysilicon regions are substantially co-planar,
  c. a first access transistor formed within and adjacent to said first polysilicon region, said first polysilicon region forming a gate electrode of said first access transistor,
  d. a first thin film load transistor formed within and adjacent to said second polysilicon region, said second polysilicon region forming a gate electrode of said first thin film load transistor,
  e. a first pull down transistor formed within and adjacent to said third polysilicon region, said third polysilicon region forming a gate electrode of said first pull down transistor, and
  f. said second polysilicon region including a contact to said silicon substrate to thereby establish a common circuit node which connects (1) said gate electrode of said first thin film load transistor, (2) a drain of said first pull down transistor, (3) a drain of said first access transistor, (4) a gate electrode of a second pull down transistor and (5) a drain of a second thin film load transistor.

6. The device defined in claim 5 wherein said first thin film load transistor is formed in part by a second level of polysilicon formed over and electrically isolated from said second polysilicon region and doped to form source, drain and channel regions of said first thin film load transistor.

7. The device defined in claim 6 which further includes a thick oxide layer disposed on top of said first access transistor, and said second level of polysilicon is extended from said source, drain and channel regions of said first thin film load transistor over said thick oxide region where it is substantially capacitively decoupled from said first access transistor.

* * * * *

UNITED STATES PATENT AND TRADEMARK OFFICE
CERTIFICATE OF CORRECTION

PATENT NO. : 5,422,499

DATED : June 6, 1995

INVENTOR(S) : Monte Manning

It is certified that error appears in the above-identified patent and that said Letters Patent is hereby corrected as shown below:

```
Column 1, line 4, insert the following:
```

--This invention was made with Government support under Contract No. MDA972-92-C-0054 awarded by Advanced Research Projects Agency (ARPA). The government has certain rights in this invention.--

Signed and Sealed this

Twelfth Day of May, 1998

Attest:

BRUCE LEHMAN

Attesting Officer

Commissioner of Patents and Trademarks